United States Patent
Yonkee et al.

(10) Patent No.: US 11,164,997 B2
(45) Date of Patent: Nov. 2, 2021

(54) III-NITRIDE TUNNEL JUNCTION LIGHT EMITTING DIODE WITH WALL PLUG EFFICIENCY OF OVER SEVENTY PERCENT

(71) Applicant: THE REGENTS OF THE UNIVERSITY OF CALIFORNIA, Oakland, CA (US)

(72) Inventors: Benjamin P. Yonkee, Goleta, CA (US); Erin C. Young, Santa Barbara, CA (US); James S. Speck, Santa Barbara, CA (US); Steven P. DenBaars, Goleta, CA (US); Shuji Nakamura, Santa Barbara, CA (US)

(73) Assignee: THE REGENTS OF THE UNIVERISTY OF CALIFORNIA, Oakland, CA (US)

( * ) Notice: Subject to any disclaimer, the term of this patent is extended or adjusted under 35 U.S.C. 154(b) by 0 days.

(21) Appl. No.: 16/320,924

(22) PCT Filed: Aug. 17, 2017

(86) PCT No.: PCT/US2017/047358
§ 371 (c)(1),
(2) Date: Jan. 25, 2019

(87) PCT Pub. No.: WO2018/035331
PCT Pub. Date: Feb. 22, 2018

(65) Prior Publication Data
US 2019/0165213 A1   May 30, 2019

Related U.S. Application Data

(60) Provisional application No. 62/376,218, filed on Aug. 17, 2016.

(51) Int. Cl.
*H01L 33/32* (2010.01)
*H01L 33/14* (2010.01)
(Continued)

(52) U.S. Cl.
CPC .......... *H01L 33/32* (2013.01); *H01L 33/0075* (2013.01); *H01L 33/04* (2013.01);
(Continued)

(58) Field of Classification Search
CPC ....... H01L 33/385; H01L 33/32; H01L 33/14; H01L 33/04; H01L 33/0075
See application file for complete search history.

(56) References Cited

U.S. PATENT DOCUMENTS 5,703,436 A    12/1997  Forrest et al.
2007/0029541 A1  2/2007  Xin et al.
(Continued)

OTHER PUBLICATIONS

PCT International Search Report & Written Opinion dated Oct. 30, 2017, Application No. PCT/US2017/047358.
(Continued)

*Primary Examiner* — Marcos D. Pizarro
*Assistant Examiner* — Antonio B Crite
(74) *Attorney, Agent, or Firm* — Gates & Cooper LLP

(57) ABSTRACT

A III-Nitride LED which utilizes n-type III-Nitride layers for current spreading on both sides of the device. A multilayer dielectric coating is used underneath the wire bond pads, both LED contacts are deposited in one step, and the p-side wire bond pad is moved off of the mesa. The LED has a wall plug efficiency or External Quantum Efficiency (EQE) over 70%, a fractional EQE droop of less than 7% at 20 A/cm$^2$ drive current and less than 15% at 35 A/cm$^2$ drive current. The LEDs can be patterned into an LED array and each LED can have an edge dimension of between 5 and 50 μm. The LED emission wavelength can be below 400 nm and aluminum can be added to the n-type III-Nitride layers such that the bandgap of the n-type III-nitride layers is larger than the LED emission photon energy.

15 Claims, 14 Drawing Sheets

(51) Int. Cl.
*H01L 33/00* (2010.01)
*H01L 33/04* (2010.01)
*H01L 33/42* (2010.01)
*H01L 33/20* (2010.01)
*H01L 33/38* (2010.01)
*H01S 5/343* (2006.01)

(52) U.S. Cl.
CPC .............. *H01L 33/14* (2013.01); *H01L 33/42* (2013.01); *H01S 5/343* (2013.01); *H01L 33/20* (2013.01); *H01L 33/385* (2013.01); *H01L 2224/48091* (2013.01)

(56) References Cited

U.S. PATENT DOCUMENTS

| | | | |
|---|---|---|---|
| 2007/0045640 A1* | 3/2007 | Erchak | G02B 6/0068 257/98 |
| 2008/0116477 A1* | 5/2008 | Komada | H01L 33/14 257/103 |
| 2008/0169117 A1 | 7/2008 | Wang et al. | |
| 2010/0025719 A1 | 2/2010 | Li | |
| 2010/0032648 A1* | 2/2010 | Lu | H01L 33/04 257/13 |
| 2012/0199843 A1 | 8/2012 | Heikman et al. | |
| 2013/0140519 A1* | 6/2013 | Zhu | H01L 33/22 257/13 |
| 2013/0299777 A1* | 11/2013 | Nakamura | H01L 33/32 257/13 |
| 2014/0252390 A1* | 9/2014 | Yoon | H01L 33/405 257/98 |
| 2015/0233536 A1* | 8/2015 | Krames | F21V 5/048 362/84 |
| 2016/0093773 A1* | 3/2016 | Sano | H01L 33/32 257/13 |

OTHER PUBLICATIONS

Young, E.C., et al., "Hybrid tunnel junction contacts to III-nitride light-emitting diodes", Applied Physics Express, 2016, pp. 022102-1-022102-4, vol. 9.

Yonkee, B.P., et al., "Demonstration of a III-nitride edge-emitting laser diode utilizing a GaN tunnel junction contact", Optics Express, Apr. 2016, pp. 1-7, vol. 24, No. 7.

Yonkee, B.P., et al., "Silver free III-nitride flip chip light-emitting-diode with wall plug efficiency over 70% utilizing a GaN tunnel junction", Applied Physics Letters, 2016, pp. 191104-1-191104-4, vol. 109.

Reading, A.H., et al., "High efficiency white LEDs with single-crystal ZnO current spreading layers deposited by aqueous solution epitaxy", Optics Express, Jan. 2012, pp. 1-7, vol. 20, No. S1.

Esaki, L., "New Phenomenon in Narrow Germanium p-n Junctions", Physical Review, 1958, pp. 603-604, vol. 109.

Simon, J., et al., "Polarization-Induced Hole Doping in Wide-Band-Gap Uniaxial Semiconductor Heterostructures", Science, Jan. 2010, pp. 60-64, vol. 327.

Krishnamoorthy, S., et al., "InGaN/GaN tunnel junctions for hole injection in GaN light emitting diodes", Applied Physics Letters, 2014, pp. 141104-1-141104-4, vol. 105.

Krishnamoorthy, S., et al., "GdN Nanoisland-Based GaN Tunnel Junctions", Nano Letters, 2013, pp. 2570-2575, vol. 13.

* cited by examiner

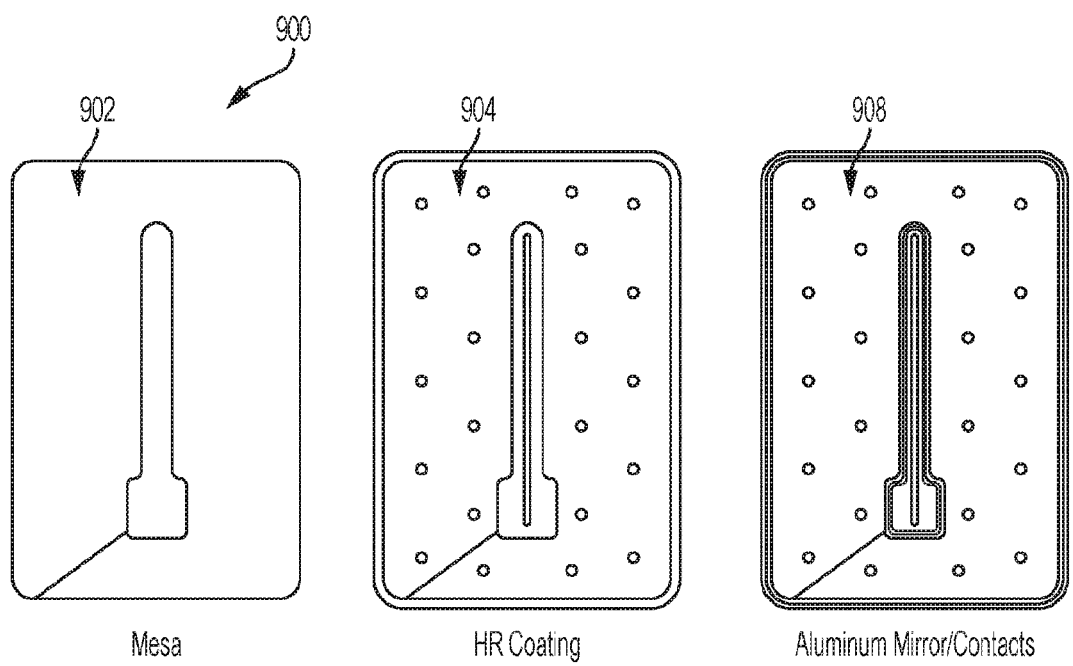
*Figure 10(a)*   *Figure 10(b)*   *Figure 10(c)*

III-NITRIDE TUNNEL JUNCTION LIGHT EMITTING DIODE WITH WALL PLUG EFFICIENCY OF OVER SEVENTY PERCENT

CROSS REFERENCE TO RELATED APPLICATIONS

This application claims the benefit under 35 U.S.C. Section 119(e) and commonly-assigned U.S. Provisional Patent Application No. 62/376,218, filed on Aug. 17, 2016, by Benjamin P. Yonkee, Erin C. Young, James S. Speck, Steven P. DenBaars, and Shuji Nakamura, entitled "III-NITRIDE TUNNEL JUNCTION LIGHT EMITTING DIODE WITH WALL PLUG EFFICIENCY OF OVER SEVENTY PERCENT," which application is incorporated by reference herein.

This application is related to the following commonly-assigned U.S. patent applications:

International PCT Application No. PCT/US17/16720 filed Feb. 6, 2017, entitled III-NITRIDE LIGHT EMITTING DIODES WITH TUNNEL JUNCTIONS WAFER BONDED TO A CONDUCTIVE OXIDE AND HAVING OPTICALLY PUMPED LAYERS, by Asad J. Mughal, Stacy J. Kowsz, Robert M. Farrell, Benjamin Yonkee, Erin C. Young, Christopher D. Pynn, Tal Margalith, James S. Speck, Shuji Nakamura, and Steven P. DenBaars, which application claims the benefit under 35 U.S.C. Section 119(e) of the following commonly-assigned applications:

U.S. Provisional Application Ser. No. 62/292,015, filed on Feb. 5, 2016, by James S. Speck, Asad Mughal, Erin C. Young, and Steven P. DenBaars, entitled "LIGHT EMITTING DIODE WITH A TUNNEL JUNCTION CONTACT WAFER BONDED TO A CONDUCTIVE OXIDE,";

U.S. Provisional Application Ser. No. 62/298,268, filed on Feb. 22, 2016, by Stacy J. Kowsz, Robert M. Farrell, Benjamin Yonkee, Erin C. Young, Christopher D. Pynn, Tal Margalith, Shuji Nakamura, and Steven P. DenBaars, entitled "TUNNEL JUNCTION DEVICES WITH MONOLITHIC OPTICALLY-PUMPED AND ELECTRICALLY-INJECTED III-NITRIDE LAYERS," (2016-325-1);

PCT International Utility Patent Application Serial No. PCT/US16/59929, filed on Nov. 1, 2016, by Benjamin P. Yonkee, Erin C. Young, John T. Leonard, Tal Margalith, James S. Speck, Steven P, DenBaars, and Shuji Nakamura entitled III-NITRIDE TUNNEL JUNCTION WITH MODIFIED P-N INTERFACE, which application claims the benefit under 35 U.S.C. § 119 of U.S. Provisional Patent Application No. 62/250,758, filed on Nov. 4, 2015, by Benjamin P. Yonkee, Erin C. Young, John T. Leonard, Tal Margalith, James S. Speck, Steven P. DenBaars, and Shuji Nakamura, entitled "III-NITRIDE TUNNEL JUNCTION WITH MODIFIED P-N INTERFACE" (UC Ref 2016-245-1);

PCT International Utility Patent Application Ser. No. PCT/US16/41744, filed on Jul. 11, 2016, by Erin C. Young, Benjamin P. Yonkee, John T. Leonard, Tal Margalith, James S. Speck, Steven P. DenBaars, and Shuji Nakamura, entitled "HYBRID GROWTH METHOD FOR III-NITRIDE TUNNEL JUNCTION DEVICES," (2015-904), which application claims the benefit under 35 U.S.C. § 119 of U.S. Provisional Application Ser. No. 62/190,929, filed on Jul. 10, 2015, by Erin C. Young, Benjamin P. Yonkee, John T. Leonard, Tal Margalith, James S. Speck, Steven P. DenBaars, and Shuji Nakamura, entitled "HYBRID GROWTH METHOD FOR III-NITRIDE TUNNEL JUNCTION DEVICES," (2015-904-1);

all of which applications are incorporated by reference herein.

BACKGROUND OF THE INVENTION

1. Field of the Invention

This invention relates to methods and devices for improving performance of III-nitride light emitting devices.

2. Description of the Related Art (Note: This application references a number of different references as indicated throughout the specification by one or more reference numbers in brackets, e.g.,[x]. A list of these different references ordered according to these reference numbers can be found below in the section entitled "References." Each of these references is incorporated by reference herein.)

Current commercially-available III-nitride light-emitting diodes (LEDs) use an active region in a biased p-n junction to allow for electron and hole injection. However, the p-GaN is difficult to contact electrically and has low hole concentration and mobility. This means that p-GaN cannot be used as a current spreading layer and that traditional p-contacts will add significant voltage to devices. Despite these inherent problems, all commercial light emitting devices utilize a p-contact and a material other than p-GaN for current spreading, typically transparent conducting oxides (TCO).

There is a need to improve the performance of III-nitride light-emitting devices. The present invention satisfies this need.

SUMMARY OF THE INVENTION

To overcome the limitations described above, and to overcome other limitations that will become apparent upon reading and understanding this specification, the present invention described herein discloses a tunnel junction in a III-Nitride LED to increase efficiency, and wherein n-GaN is used for current spreading to produce less loss than a traditional transparent conducting oxide such as Indium Tin Oxide (ITO). The excellent current spreading provided by the n-GaN layer also helps to reduce the droop observed in III-Nitride LEDs.

One or more embodiments of the present disclosure describe a III-nitride optoelectronic or electronic device, comprising a chip including n-type III-Nitride layers for current spreading on two sides of the device chip.

To better illustrate the composition of matter and methods described herein, a non-limiting list of examples is provided here.

In Example 1, the device comprising a multilayer dielectric coating underneath a bond pad on the chip and between the bond pad and a surface of the chip, In Example 2, the device of one or any combination of previous examples further comprising a p-side bond pad, wherein the chip comprises a mesa and the p-side bond pad is separated from the mesa.

In Example 3, the device of one or any combination of previous examples further comprising a conductive track electrically connecting the p-side bond pad to an n-contact on the mesa, wherein the conductive track conforms with a shape of the chip.

In Example 4, the device of one or any combination of previous examples, wherein the device has a wall plug efficiency and/or external quantum efficiency (EQE) over 70%.

In Example 5, the device of one or any combination of previous examples, wherein the device has a fractional External Quantum Efficiency (EQE) droop of less than 7% at 20 A/cm² drive current density and less than 15% at 35 A/cm² drive current density.

In Example 6, the device of one or any combination of previous examples, wherein the device comprises one or more light emitting diodes (LEDs) or one or more laser diodes (LDs).

In Example 7, the device of one or any combination of previous examples further comprising one or more of the LEDs or LDs having an edge dimension of between 5 micrometers (μm) and 50 μm.

In Example 8, the device of one or any combination of previous examples, wherein the LEDs or LDs are patterned into an array.

In Example 9, the device of one or any combination of previous examples, wherein the LED's or LD's emission wavelength is below 400 nm.

In Example 10, the device of one or any combination of previous examples, wherein aluminum is added to the n-type III-Nitride layers of the device such that the bandgap of the n-type III-nitride layers is larger than the LED's emission photon energy.

In Example 11, a method of forming the device of one or any combination of previous examples, wherein both the LED's or LD's n-type contacts are deposited in one step.

The present disclosure further describes an optoelectronic device comprising a dielectric coating underneath at least one of the device's bond pads, e.g., wherein the dielectric coating is only underneath the (e.g., wire) bond pads.

BRIEF DESCRIPTION OF THE DRAWINGS

Referring now to the drawings in which like reference numbers represent corresponding parts throughout:

FIG. 10(a) shows the mesa in the flip chip LED design.

FIG. 10(b) shows the HR coating in the flip chip LED design.

FIG. 10(c) shows the aluminum mirror/contacts in the flip chip LED design.

DETAILED DESCRIPTION OF THE INVENTION

Figure 1:
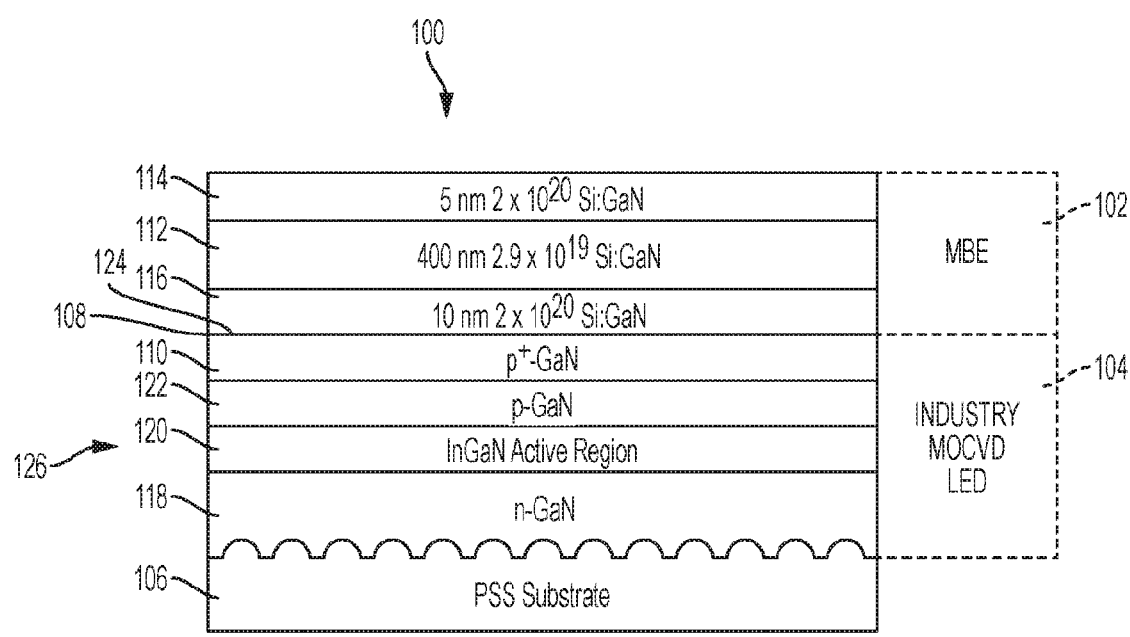
FIG. 1 illustrates the epi schematic utilized for the tunnel junction LEDs, wherein a Molecular Beam Epitaxy (MBE) regrowth was carried out to form a low voltage GaN tunnel junction.

In the following description of the preferred embodiment, reference is made to the accompanying drawings that form a part hereof, and in which is shown by way of illustration a specific embodiment in which the invention may be practiced. It is to be understood that other embodiments may be utilized and structural changes may be made without departing from the scope of the present invention.

Technical Description

Overview A very highly doped ($n^+/p^+$) interface can allow for electrons to tunnel between the valence band and conduction band. This was first demonstrated by Esaki in highly doped Ge homojunctions [1] with very thin depletion regions. This type of diode is also known as a tunnel junction.

A low resistance tunnel junction could expand the design space of III-Nitride based LEDs, edge emitting laser diodes (EELDs), and Vertical Cavity Surface Emitting Lasers (VC-SELs), and multi junction solar cells. A tunnel junction incorporated into these optoelectronic devices allows for the epitaxial structure of the device to use n-GaN on both sides. This could eliminate p-contacts and replace them with lower resistance n-contacts. In addition, n-GaN can be used as an effective current spreading layer. The use of n-GaN for current spreading would allow for the elimination of a transparent conducting oxide (TCO) or silver mirror in an optoelectronic device design.

There have been a number of difficulties in achieving high quality tunnel junctions in the GaN system. GaN is a wide bandgap semiconductor which means the barrier for tunneling is high. Several approaches to reducing the tunneling barrier have been attempted, including bandgap engineering via polarization (AlN interlayers) [2], reducing the bandgap with an InGaN interlayer [3], and introducing defect states via interfacial GdN nanoparticles [4]. However, all of these approaches are associated with losses either in terms of voltage or resistance increases, or optical losses in the final device performance. In principle, a highly doped Esaki type homojunction diode should provide the lowest-loss tunnel junction. However, magnesium (Mg) doped p-GaN grown by Metal Organic Chemical Vapor Deposition (MOCVD) is compensated by hydrogen as grown, and it must be annealed after growth to remove hydrogen. This anneal can only work if the p-GaN is not covered by n-GaN, as hydrogen cannot easily diffuse through n-GaN. This limits the effectiveness of tunnel junctions and prevents their widespread use. Unlike MOCVD grown p-GaN, MBE p-GaN is conductive as grown, which would allow for its use in a tunnel junction. Additionally, the doping limits of MBE materials are higher which could allow for better tunnel junctions In a previous disclosure [5], it was shown that combining MOCVD grown light emitters and MBE grown tunnel junctions one could reduce the operating voltage devices and increase the efficiency. Other growth techniques aside from MBE can also prevent repassivation of the p-GaN layers. The present invention demonstrates the use of a multilayer dielectric high reflectivity (HR) coating combined with an aluminum reflector to form a mirror for a flip chip LED. This mirror does not form an electrical contact to the LED and can only be used because the regrown n-GaN layer can provide lateral current spreading.

Epitaxial Structure Fabrication

FIG. 1 shows an example epitaxial structure 100 and device design for the LEDs. An MBE regrowth 102 is carried out on a standard MOCVD LED epitaxial structure 104 grown on a patterned sapphire substrate 106, to produce a tunnel junction 108 between the MOCVD p+ layer 110 and the MBE regrown layer 102. The n-type III-nitride 102 (e.g., n-GaN) grown by MBE can then be used as a current spreading layer in optoelectronic devices. The present invention discloses results on LEDs but this invention can be used in many ITT-Nitride devices.

The MBE regrowth 202 comprises n-type GaN (n-GaN) layer 112 (400 nanometers (nm) thick $2.9\times10^{19}$ Si doped GaN (Si:GaN)) between $n^+$-type GaN layers 114 (5 nm thick $2\times10^{20}$ Si:GaN) and 116 (10 nm thick $2\times10^{20}$ Si:GaN). The MOCVT) structure 104 comprises an n-type (e.g., n-GaN) layer 118 on the substrate 106 (e.g., PSS), an active region 120 (e.g., InGaN layer) on the n-type layer 118, a p-type GaN layer 122 on the active region 120, and a $p^+$-type layer e.g., GaN layer) 110 on the (e.g., p-GaN) layer 122 and contacting $n^+$-type layer 118. As used herein, n+-type means higher n-type dopant concentration than n-type, and p+-type means higher p-type dopant concentration than p-type. The GaN layers 110, 112, 114, 116, 118 and 122 can be III-nitride layers instead of GaN layers.

Example Fabrication

Standard industrially grown blue LED wafers grown on patterned sapphire substrates were obtained. Before the MBE regrowth 102, the wafers were diced into small pieces and solvent cleaned. A 15 minute anneal in an $N_2/O_2$ atmosphere at 550° C. was carried out to activate the samples and a one minute dip in 49% HF acid was done to clean the surface 124. An HF dip was found to produce the lowest voltage for the tunnel junction 108 formed by regrowth 102. The samples were then indium bonded and loaded into a VEEECO 930 III-nitride MBE system equipped with an ammonia source. An in situ ammonia anneal was done at 600° C. to clean the surface 124. After heating to a growth temperature of 750° C., a 10 nm $n^+$-GaN layer ([Si]: $2\times10^{20}$) 116 was grown to form the tunnel junction 108. The ammonia overpressure under the MBE growth conditions was low enough to prevent passivation of the p-GaN 110, 122 with hydrogen. For the transparent design, a 400 nm layer of n-GaN Oil: $2.9\times10^{19}$) 112 was then grown to act as a current spreading layer and an additional 5 nm $n^+$-GaN layer 114 was grown for n-contacts.

EXAMPLE 1

Transparent LED or PSS Lateral TJ LED Structure and Fabrication

A lateral LED is term used for LEDs that use ITO or ZnO for current spreading on the top layer.

Figure 2:
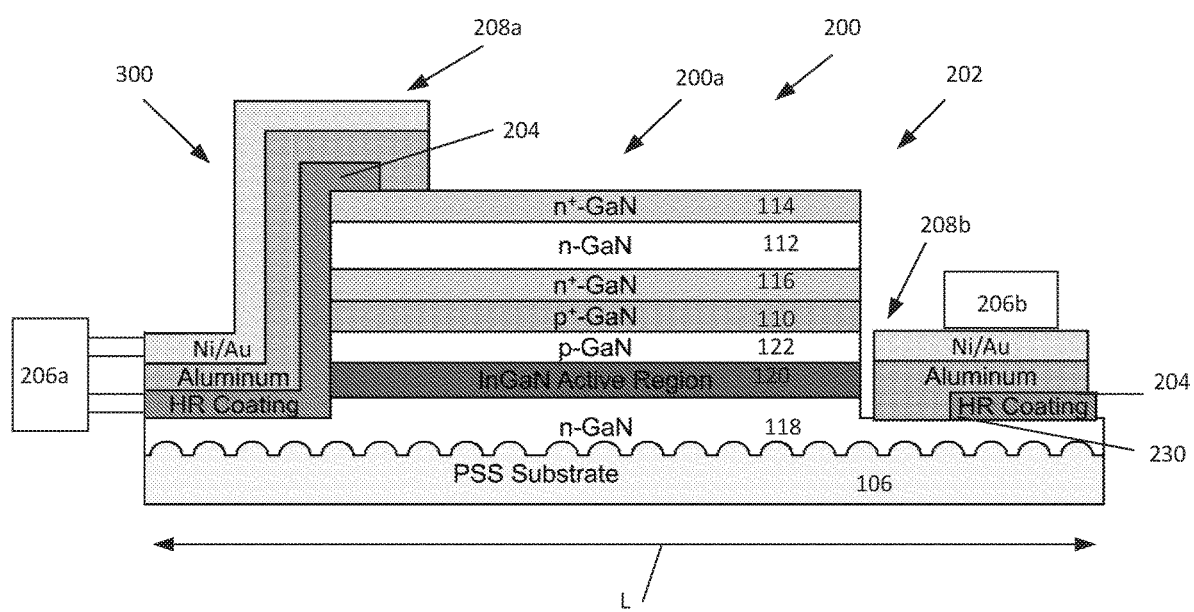
FIG. 2 illustrates a patterned sapphire substrate (PSS) lateral Tunnel Junction (TJ) LED design that can be fabricated in three lithographic steps (mesa, dielectric, contacts), has both wire bond pads removed from the mesa, has aluminum topside contacts covering less than 10% of the chip by area, and has the high reflectivity (HR) coating (e.g., a 7 dielectric stack for high reflectivity) under the wire bond pads (when backed by aluminum, the HR forms a good omnidirectional coating).

FIG. 2 illustrates the lateral tunnel junction LED 200 on a PSS substrate 106 and having a high reflective (HR) coating 204 under the wire bond pads 206a, 206b.

For the transparent LEDs 200 according to an embodiment of the present invention, a mesa 202 etch was first done using reactive ion etching (RIE) with $SiCl_4$. A dielectric coating 204 was then deposited to reduce optical loss of the wire bond pads 206a, 206b. In one embodiments, the dielectric coating 204 comprises seven-layer dielectric stack consisting of $Al_2O_3/Ta_2O_5/SiO_2$ was designed using TFCalc which increased the reflectivity of the wire bond pads 206a, 206b to over 98% at a wavelength of 450 nm. The topside wire bond pad 206a was also moved off the mesa 202 to prevent it from reflecting light (emitted under it) back into the chip 200a. A 600/200/1000 nm Al/Ni/Au metal stack was deposited by electron beam evaporation to form contacts 208a, 208b on the top and bottom n-GaN layers 114, 118. A specific contact resistance of $4.4\times10^{-7}$ $\Omega cm^2$ for unannealed aluminum contacts 208 was achieved and a reflectivity of 85% at a wavelength of 450 nm helped increase light extraction.

Figure 3:
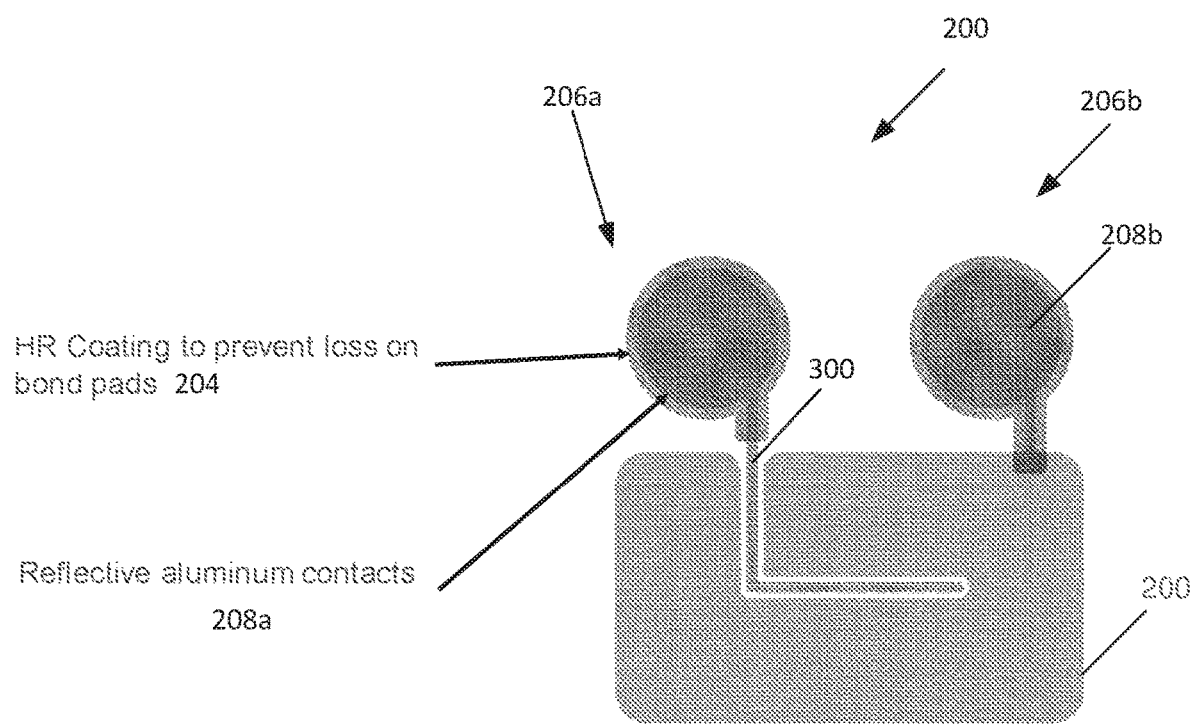
FIG. 3 illustrates the lateral tunnel junction LED mask design showing HR coating to prevent loss on the bond pads and reflective aluminum contacts.

FIG. 3 illustrates the lateral tunnel junction LED mask design showing HR coating 204 to prevent loss on the bond pads 206a, 206b and reflective aluminum contacts 208a, 208b as well as conformal conductive path or track 300 connecting the topside contact 208a to the bond pad 206a, wherein the track conforms to the shape of the LED chip 200a.

The LEDs were then diced and packaged before measuring in an integrating sphere. Each LED was mounted on a header silver header using a clear silicone epoxy. The leads were then wire bonded and the LEDs were peeled off the header and suspended using the tension of the bond wires to hold them in the air. A high reflectivity $BaSO_4$ powder was applied to the header to reduce optical absorption. The headers were then encapsulated into an inverted cone using a silicone epoxy with a refractive index of 1.406 and were characterized in an integrating sphere using continuous wave (CW) measurements.

Figure 4:
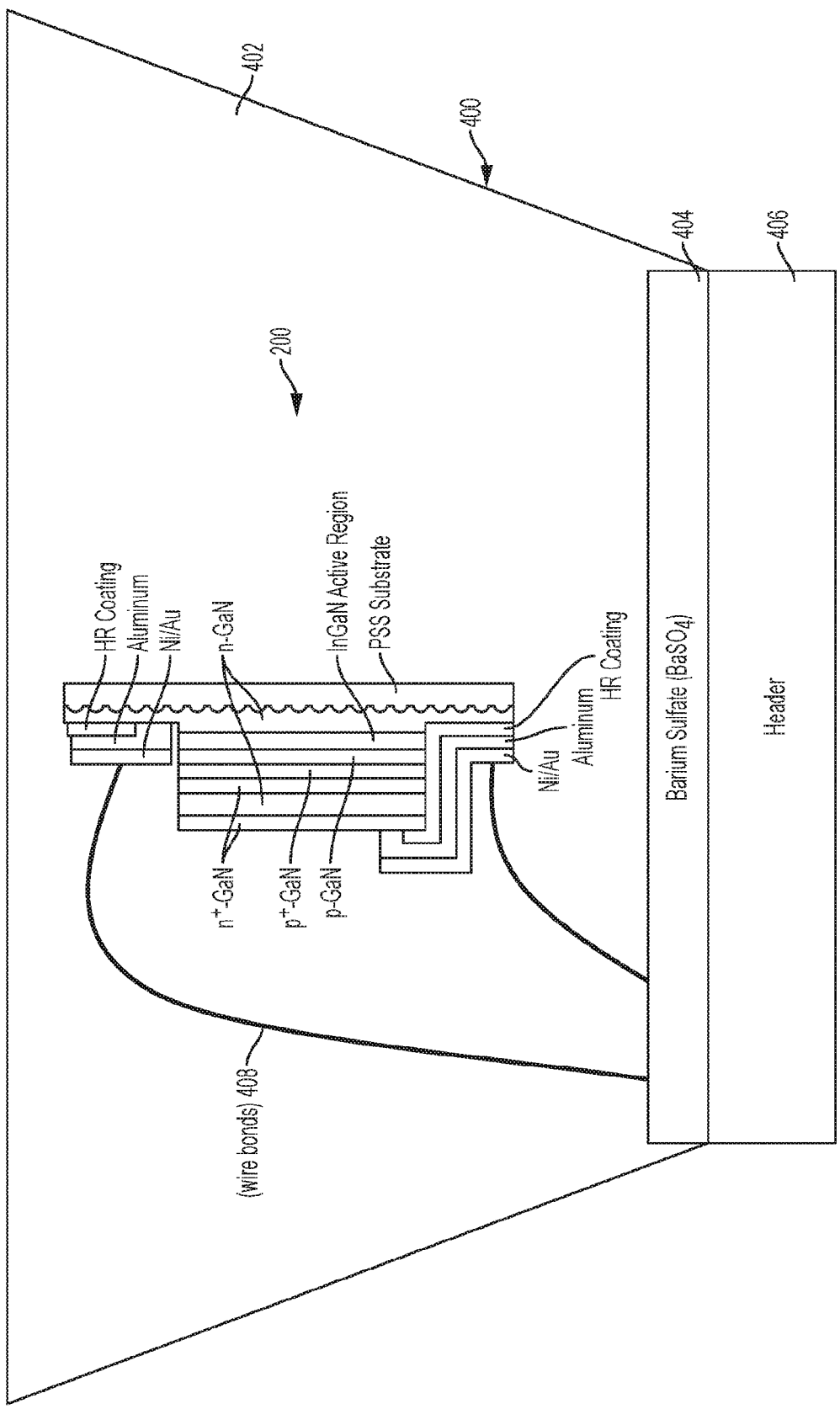
FIG. 4 illustrates the package, showing the LED floats in silicone to maximize extraction of light.

FIG. 4 illustrates the package 400, showing the LED floats in silicone 402 to maximize extraction of light. Barium sulfate 404 was used to decrease loss on the header 406 (but it is not needed). Wire bonds 408 are also shown.

Figure 5A:
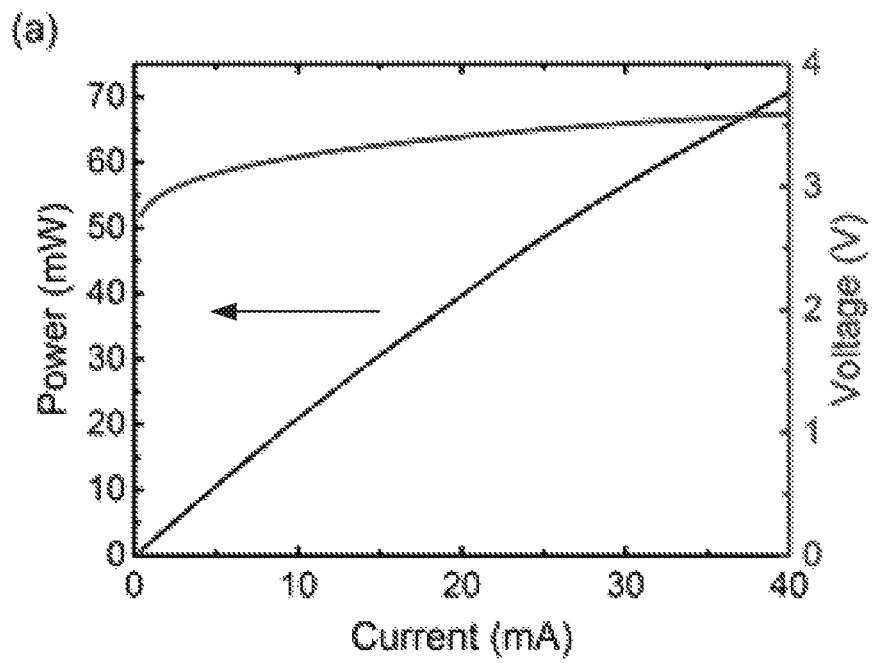
FIG. 5(a) illustrates a light-current-voltage (LIV) plot for the lateral tunnel junction LED of FIG. 4, plotting light output power in milliwatts, mW, and voltage vs current in milliamps (mA).
Figure 5B:
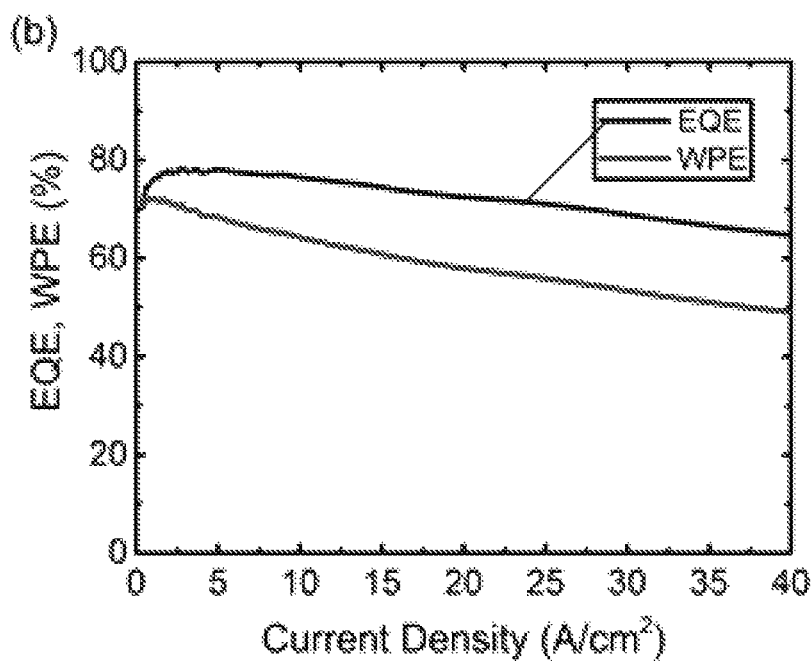
FIG. 5(b) plots the External Quantum Efficiency (EQE) and Wall Plug Efficiency (WPE) versus (vs.) current density for the LED of FIG. 4.

FIGS. 5(a)-5(b) are plots showing LIV, EQE, and WPE for the packaged transparent LED having the epitaxial structure of FIG. 1 and packaged as shown in FIG. 4, The area of the LED is 1 $mm^2$ which means 1 mA of drive current is equivalent to 1 $A/cm^2$ drive current density. The voltages at 1 and 20 $A/cm^2$ were 2.87 and 3.41 V respectively. The peak EQE is 78% at 5 $A/cm^2$ and the peak WPE is 72% at 1.5 $A/cm^2$. The EQEs at 2.0 and 35 A/cm2 were 73 and 66% respectively. This equates to EQE droops of 6.4 and 15% at 20 and 35 $A/cm^2$, respectively.

Figure 12:
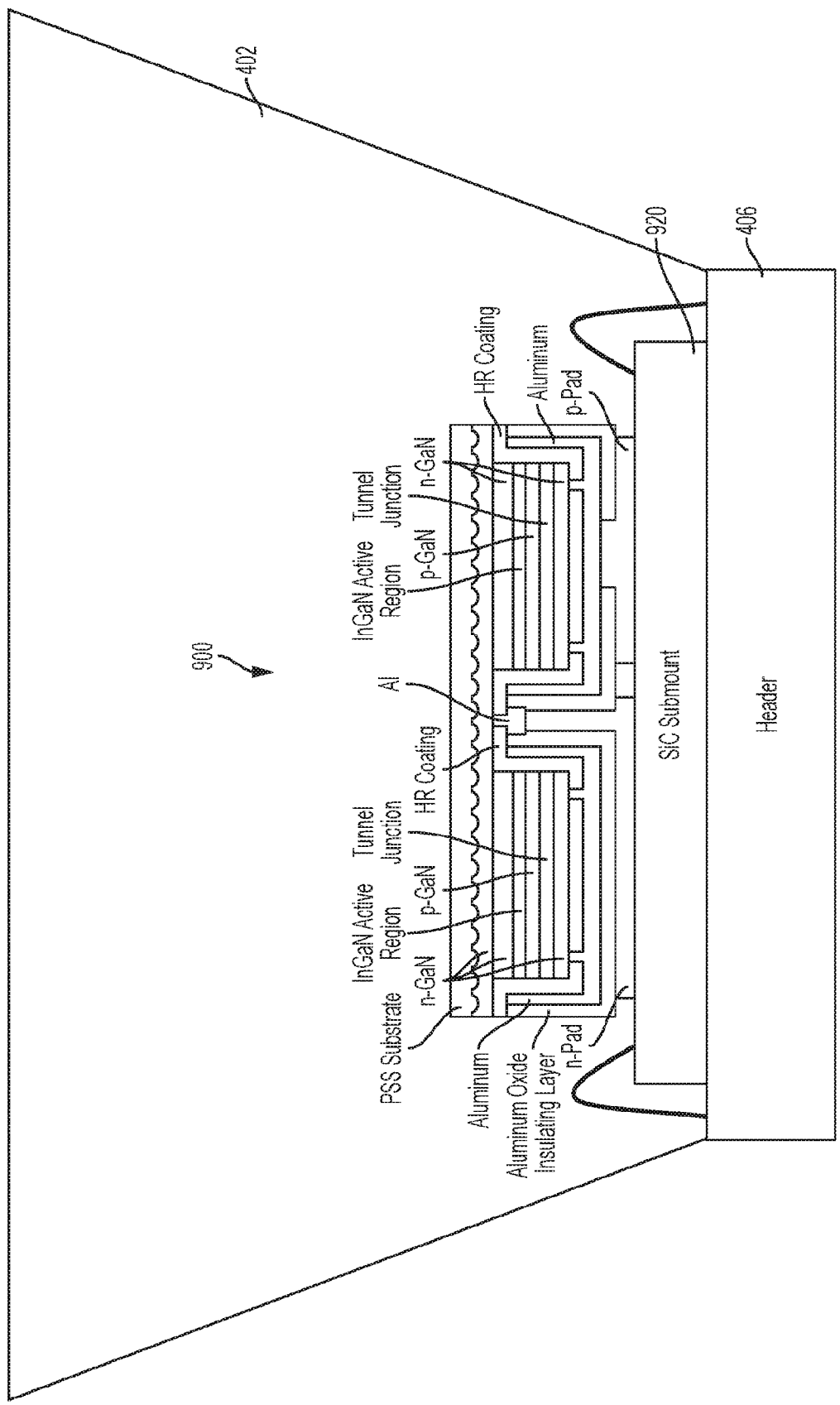
FIG. 12 illustrates the LEDs flipped onto a patterned SiC submount.

The peak WPE of 72% s for this embodiment is slightly less than the 73% obtained for the flip chip LED of FIG. 12 due to a slightly higher voltage being used (however, the EQE of 78% is higher than the peak EQE of 76% obtained for the embodiment of FIG. 12).

EXAMPLE 2

Transparent Substrate Embodiment

Figure 6:
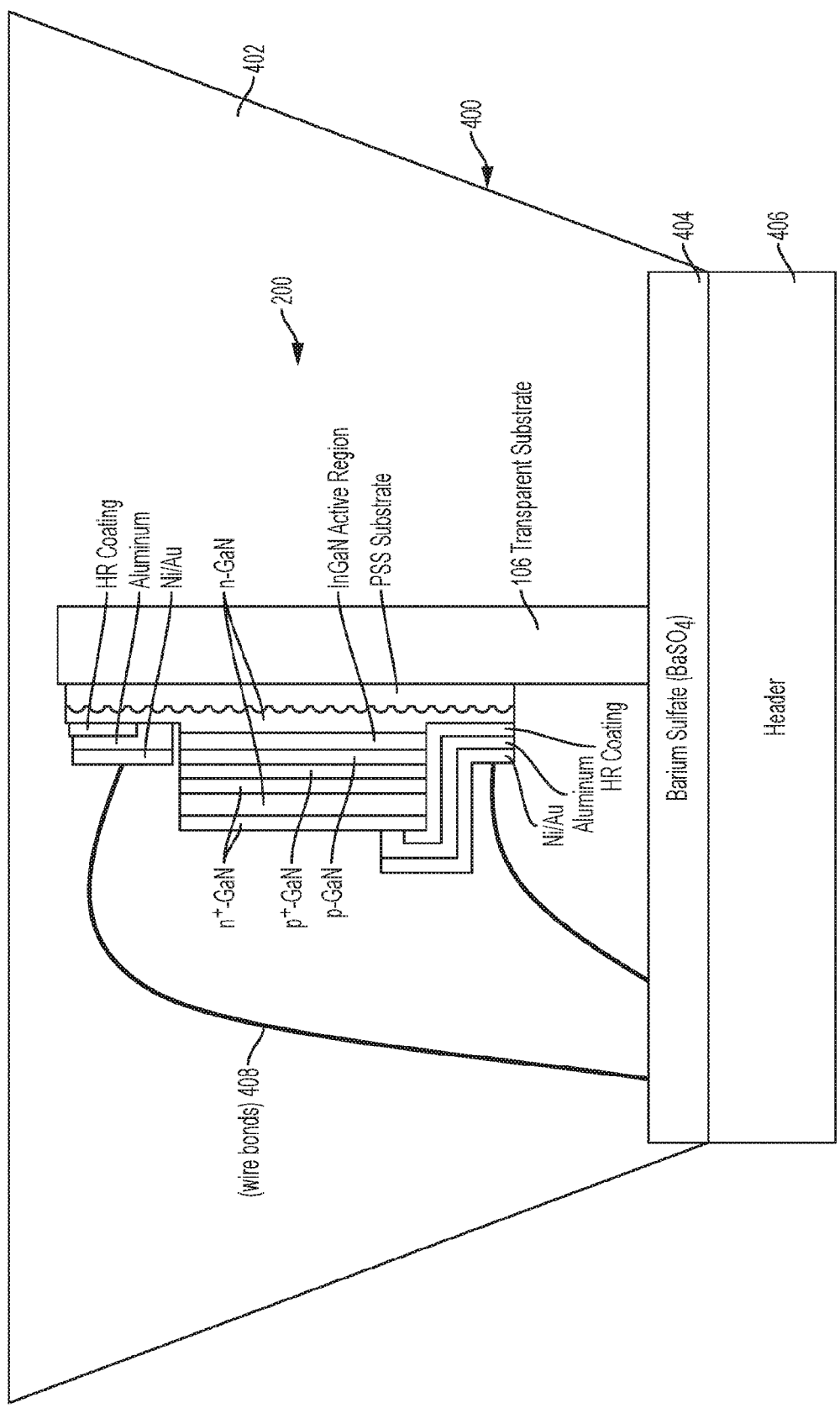
FIG. 6 illustrates an LED embodiment using a transparent substrate.

FIG. 6 illustrates an embodiment wherein a transparent substrate is used to hold the LED. In an alternative embodiment, multiple LEDs could be used on the same substrate,

EXAMPLE 3

Back Reflector Embodiment

Figure 7:
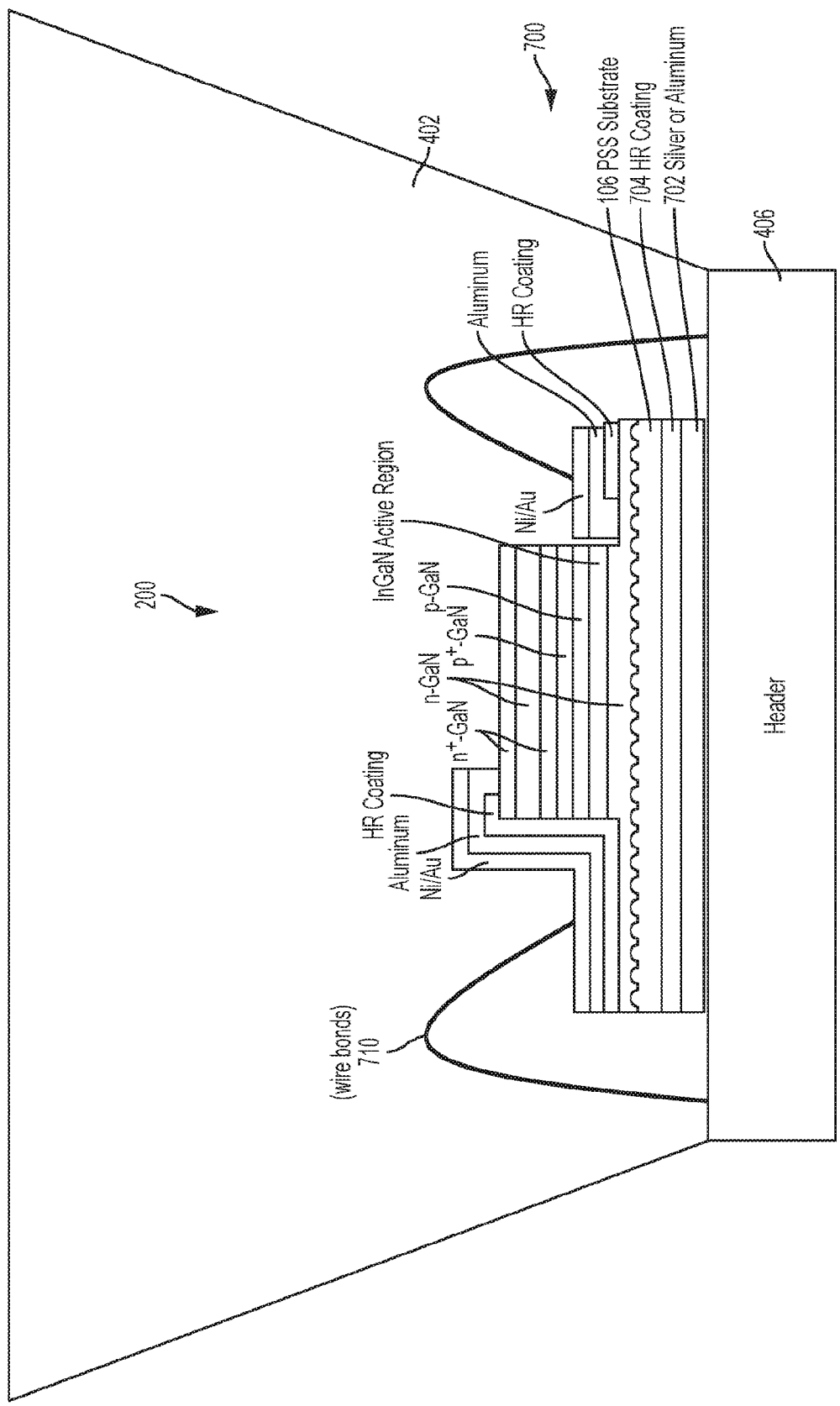
FIG. 7 illustrates an LED embodiment using a back reflector.

FIG. 7 illustrates a device embodiment 700 wherein a back reflector 702 (e.g., metal such as silver or aluminum) is used on the sapphire 106 to prevent loss on the header 406, and high reflective dielectric coating 704 is between the back reflector 702 (e.g., aluminum) and the substrate 106. Wire bonds 710 are also shown.

Figure 8A:
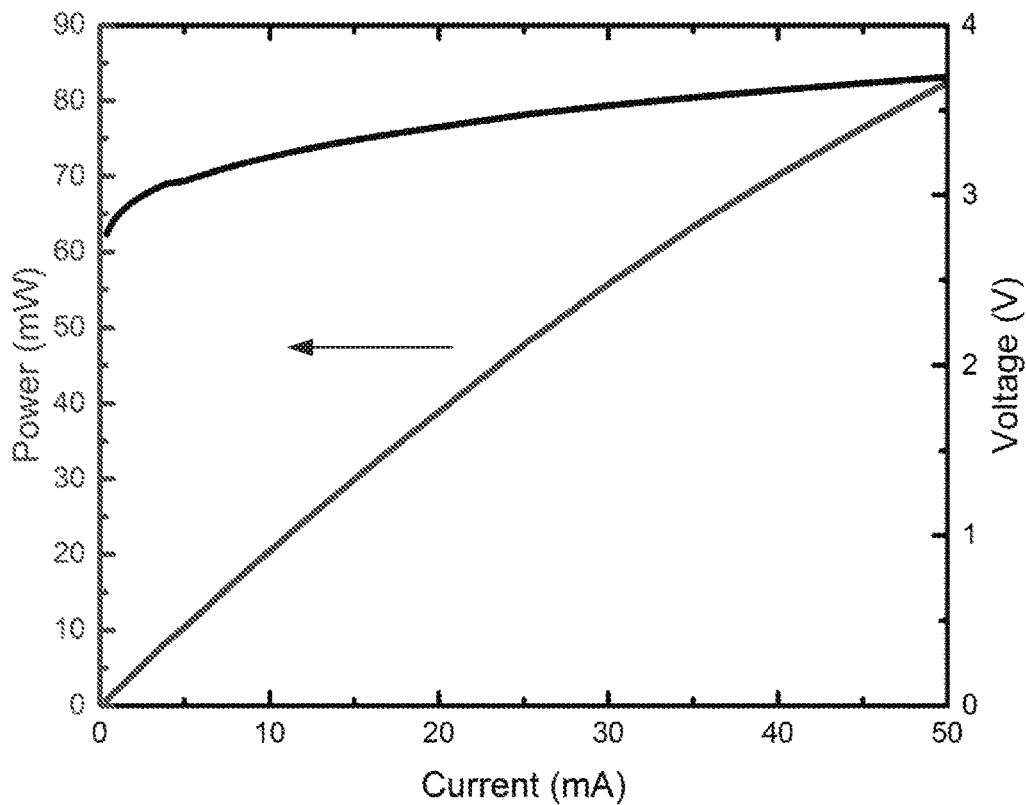
FIG. 8(a) shows the measured LIV characteristic (plotting light output power and voltage as a function of current) for the lateral TJ LED embodiment of FIG. 7.
Figure 8B:
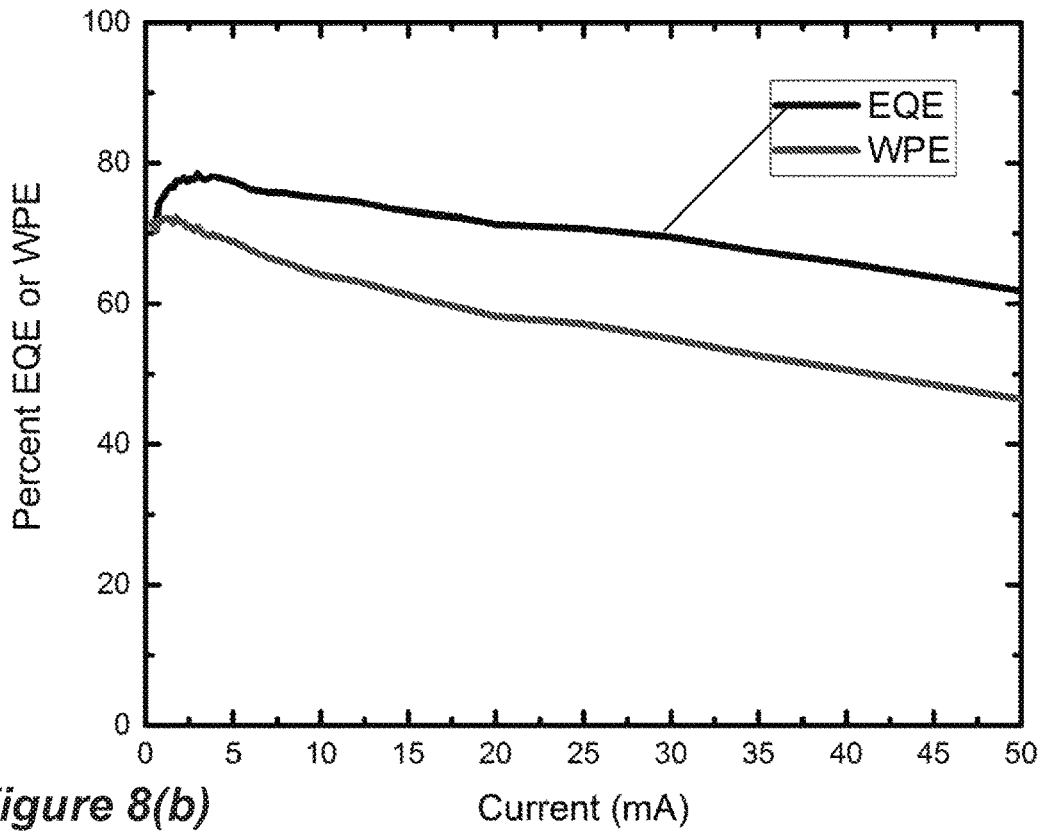
FIG. 8(b) plots the measured EQE and WPE for the lateral TJ LED embodiment (peak EQE is 78% and peak WPE is 72%) of FIG. 7.

FIG. 8(a) shows the measured LIV characteristic (plotting light output power and voltage as a function of current) for the lateral TJ LED embodiment with back reflector illustrated in FIG. 7, wherein current is injected into an area of 0.1 mm$^2$ (so that 1 mA drive current corresponds to 1 A/cm$^2$ current density), FIG. 8(b) plots the measured EQE and WPE for this lateral tunnel junction LED embodiment (peak EQE is 78% and peak WPE is 72%).

EXAMPLE 4

Flip Chip LED Design

Figure 9:
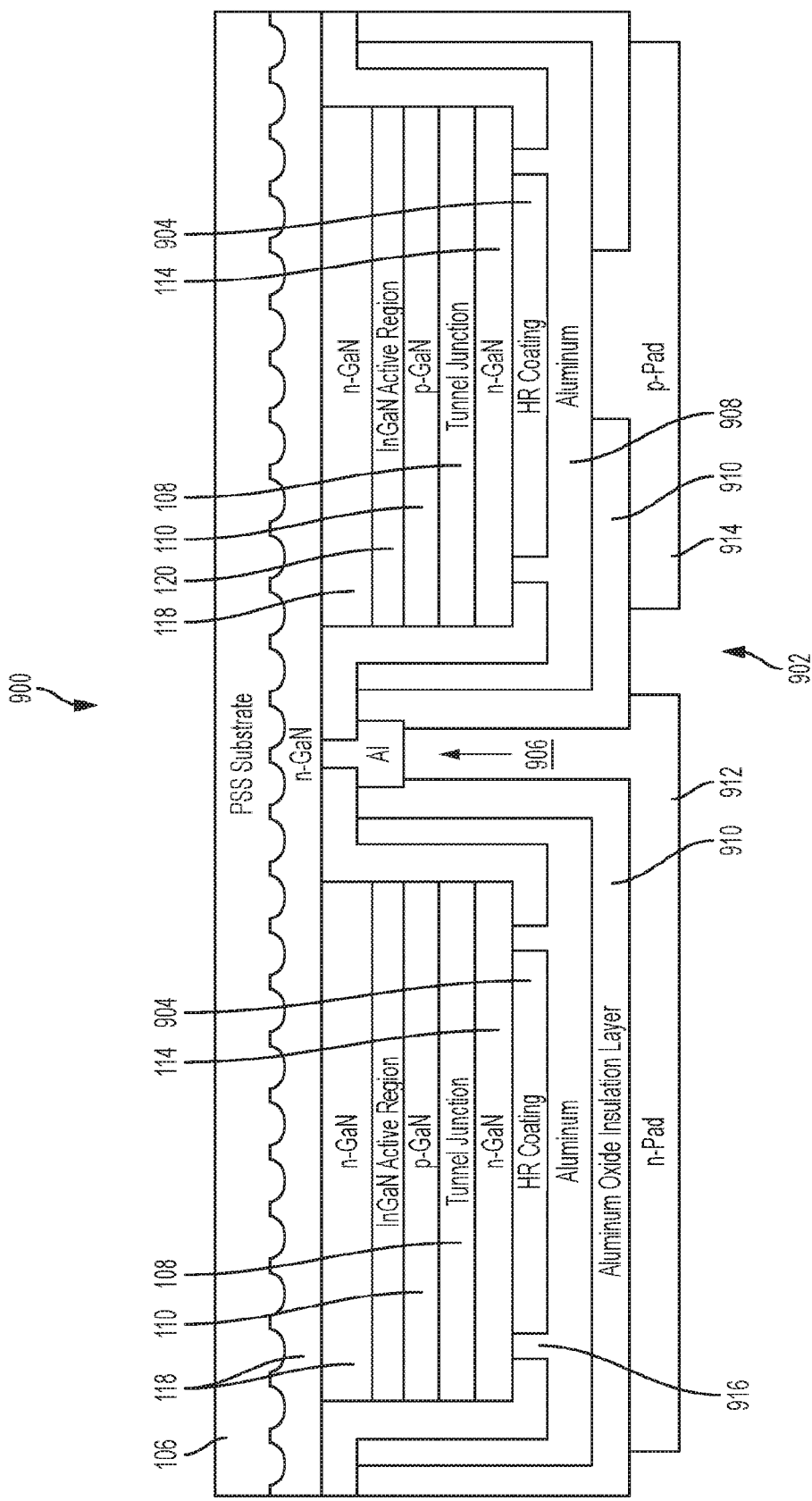
FIG. 9 illustrates a flip chip LED design.

FIG. 9 illustrates a flip chip LED design for a device 900. In one or more embodiments, the flip chip LED 900 can be fabricated in 5 lithography steps (mesa etch 902, HR coating 904, metal (e.g., aluminum) for contacts 906 and reflector 908, dielectric insulating layer 910, and n-pad 912 and p-pad 914 for bonding). The HR coating 904 and metal 908 surrounds the mesa 902 to reflect more light. One or more vias or openings 916 through the HR coating 904 allow metal in the reflector 908 to electrically and physically contact the n-GaN 114 so as to form ohmic electrical contact between the pads 912, 914 and n-GaN 114.

FIGS. 10(a)-10(c) are top views of the flip chip LED 900, showing the mesa 902, the HR coating 904, and the aluminum mirror/contacts, respectively. The coating has small gaps for contact to the LED.

Figure 11A:
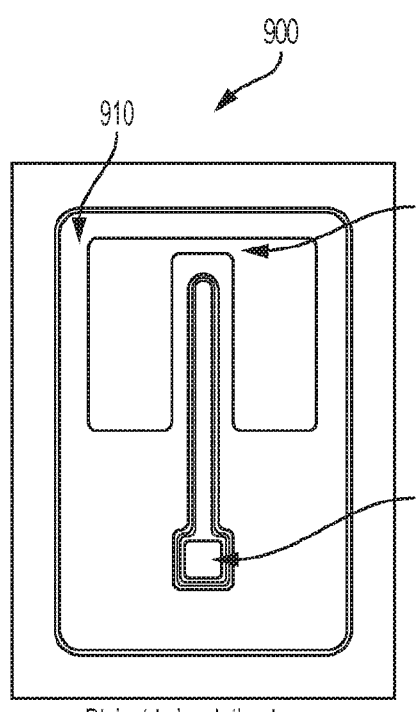
FIG. 11(a) illustrates holes in the dielectric insulating layer for the p-pad and the n-pad.

FIG. 11(a) illustrates holes 1100, 1102 in the dielectric insulating layer 910 for the p-pad 914 and the n-pad 912.

Figure 11B:
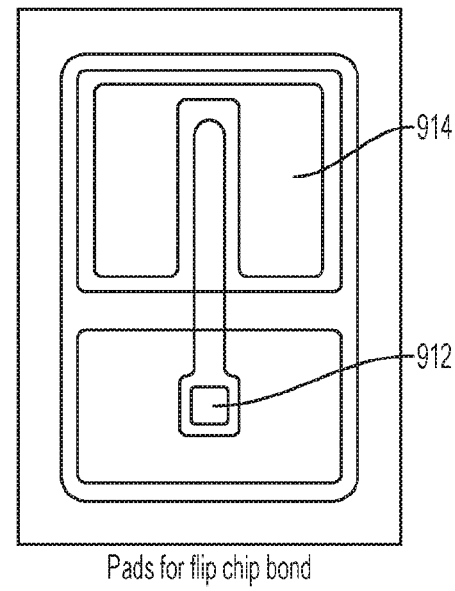
FIG. 11(b) shows the pads for the flip chip bond.

FIG. 11(b) shows the pads 914, 912 for the flip chip bond.

FIG. 12 illustrates the LEDs 900 flipped onto a submount 920 (e.g., patterned Silicon Carbide (SiC) submount) which is then bonded (e.g., wire bonded) to the header 406. The wire bonds are only used so the device can be incorporated into our standard package. Alternative embodiments (e.g., as used in industry) would just use a patterned mount.

Figure 13A:
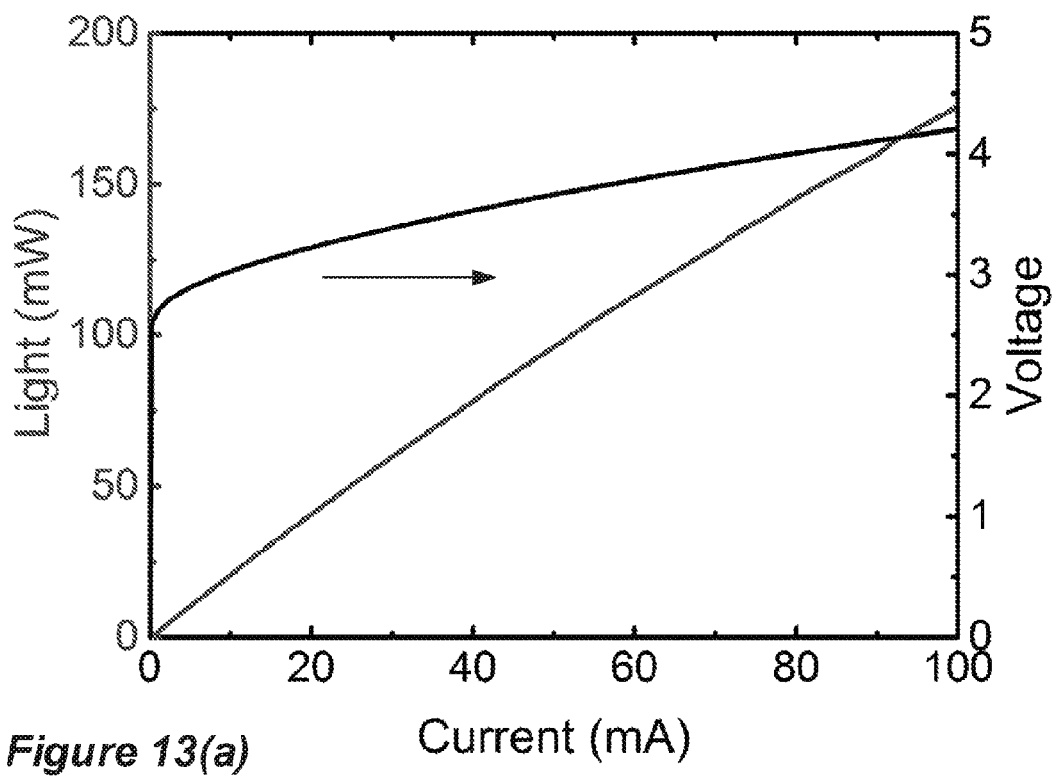
FIG. 13(a) shows the measured LIV characteristic (plotting light output power and voltage as a function of current) for the flip chip LED embodiment of FIG. 12.
Figure 13B:
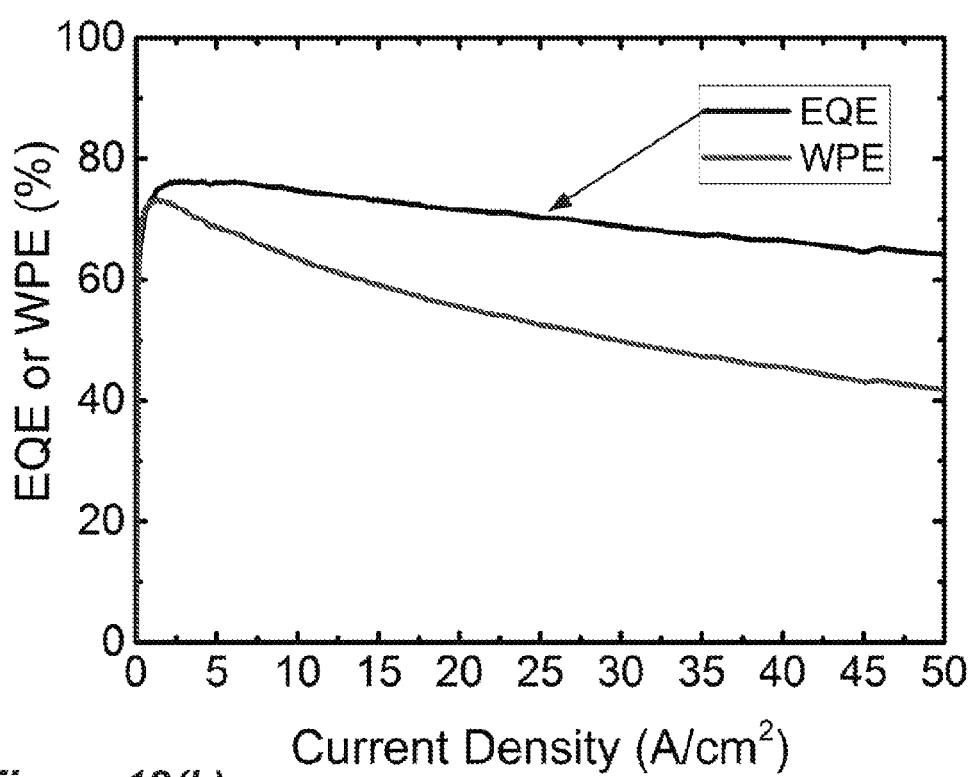
FIG. 13(b) shows the EQE and WPE for the flip chip LED embodiment of FIG. 12.

FIG. 13(a) shows the measured LIV characteristic (plotting light output power and voltage as a function of current) for the flip chip LED 900 embodiment illustrated in FIG. 12, wherein current is injected into an area of 0.2 mm$^2$ (so that 2 mA drive current corresponds to 1 A/cm$^2$ current density). FIG. 13(b) plots the measured EQE and WPE for this flip chip tunnel junction LED embodiment (peak EQE is 76% and peak WPE is 73%).

Comparison with ITO

Tunnel junctions in III-nitride LEDs have the potential to increase light extraction efficiency by reducing optical loss from both the flip chip and TCO designs. The figure of merit for a transparent conducting material is the ratio of conductivity to optical absorption and has the units of $\Omega^{-1}$. An ITO film typically has an optical absorption close to 1000 cm$^{-1}$ at 450 nm and a resistivity of about 5×10$^{-4}$ $\Omega$cm for a figure of merit of 2 $\Omega^{-1}$ [8]. An alternative to ITO is ZnO, which has been demonstrated to have a figure of merit of 2 $\Omega$−1 as well. These values are much lower than for high quality GaN (for which the absorption coefficient and conductivity can be tuned by the level of silicon doping). A typical value for epitaxial GaN is around 25 $\Omega^{-1}$ but the metric for hydride vapor phase epitaxy (HVPE) GaN wafers can be as a high as 50 $\Omega^{-1}$. Simulations done on light extraction for LEDs on patterned sapphire substrate (PSS) wafers show that ITO absorbs about 6% of the light emitted and the replacement of ITO with GaN could likely bring this below 1%.

White Lighting Embodiment

High efficiency III-Nitride tunnel junction LEDs were demonstrated on standard commercial LED wafers using the hybrid MOCVD/MBE technique. A peak EQE of 78% and a peak WPE of 72% were obtained. An LED was packaged with YAG:Ce and a peak efficacy of 190 lm/W was obtained. At 20 A/cm$^2$, the efficacy was 152 lm/W. These results highlight the potential of HI-Nitride tunnel junctions for high efficiency lighting. With further refinement of the regrowth technique, tunnel junction LEDs could be more efficient than current state of the art III-Nitride LEDs.

Process Steps

Figures 14A, 14B:
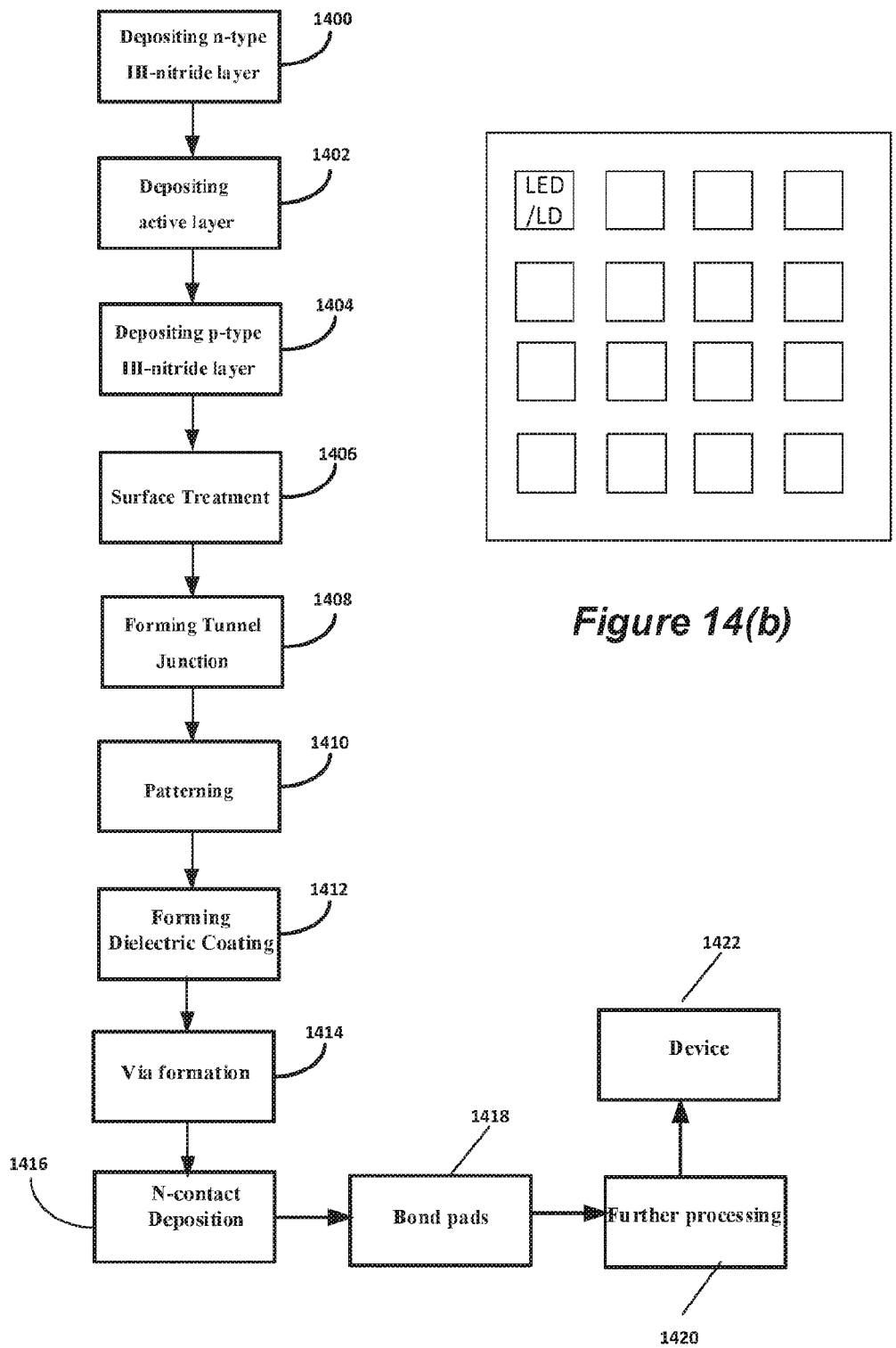
FIG. 14(a) is a flowchart illustrating a method of fabricating the device.
FIG. 14(b) illustrates an array.

FIG. 14 is a flowchart illustrating a method of fabricating an optoelectronic device.

The method can comprise the following steps (referring also to FIGS. 1, 4, 6, 7, 9, and 12).

Block 1400 represents depositing a first n-type III-nitride layer 118 (e.g., n-GaN) on or above a substrate 106. The substrate 106 can comprise a foreign substrate supporting heteroepitaxial growth of III-nitride, including, but not limited to sapphire or spinel, or a homoepitaxial III-nitride substrate, including, but not limited to GaN, AlN, or InGaN. The first n-type III-nitride layer can be deposited on a patterned surface of the foreign or homoepitaxial substrate. C-plane polar, semipolar, or nonpolar III-nitride substrates can be used to form polar, semipolar or nonpolar III-nitride device layers on the substrates.

Block 1402 represents depositing a III-nitride active layer 120 (e.g., InGaN quantum wells) on or above the n-type III-nitride layer 118.

Block 1404 represents depositing a p-type III-nitride layer or material 122 (e.g., p-GaN) on or above the III-nitride active layer 120. Layers 118-122 can be deposited by MOCVD, for example. In one or more embodiments, p-type layer comprises two layers 122, 110, with layer 110 having higher (p+) doping as compared to layer 122.

Thus, Blocks 1400-1404 illustrate an example of fabricating or obtaining a p-n junction 126 structure comprising a p-type layer or material 122/110 on or above an n-type layer or material 118.

Block 1406 represents treating a surface 124 of the p-type layer 110 (e.g., p-GaN) of the p-n junction structure 126. Surface treatment includes a one minute dip in 49% HF acid to clean the surface 124 or as described in U.S. Provisional Patent Application No. 62/376,201, filed on Aug. 17, 2016, by Benjamin P. Yonkee, Erin C. Young, James S. Speck, Steven P. DenBaars, and Shuji Nakamura, entitled "III-NITRIDE TUNNEL JUNCTION IMPROVEMENT THROUGH REDUCTION OF THE MAGNESIUM MEMORY EFFECT," (UC Ref 2017-134-1).

Block 1408 represents depositing n-type material 102 (e.g., second n-type III-nitride structure/layer on the p-type III-nitride layer), forming a tunnel junction 108 between the second n-type III-nitride layer region 102 and the p-type III-nitride layer 110. The second n-type III-nitride structure/layer 102 can comprise a thicker n-type (e.g., Si) doped. GaN layer 112 between two thinner and more highly n-type (e.g., Si) doped GaN layers 114, 116 (first and second n+ GaN layers). The first $n^+$-GaN/III-nitride layer 116 closest to the p-type III-nitride layer 110 can form the tunnel junction 108, the thicker $n^-$-GaN/III-nitride layer 112 can provide current spreading, and the second topmost $n^+$-GaN/III-nitride layer 114 can provide n-contact to the n-contact metallization 208a, 208b. These layers 102, 112, 114, 116 can be deposited by MBE, for example.

Block 1410 represents forming a mesa 202 or patterning to expose the first n-type III-nitride layer 118.

Block 1412 represents depositing a dielectric coating 204 on the second n-type III-nitride structure 102. The dielectric coating 204, 904 can be a multilayer dielectric coating comprising a multi-layer stack of alternating dielectrics.

Block 1414 represents forming one or more vias 916 through the dielectric coating 904, if necessary. The vias 916 can go through the dielectric layer 904 to allow for contact metallization using reflector 908.

Block 1416 represents, in one embodiment, depositing a metallic reflector 908 on the dielectric coating 904 and in the vias 916. In one or more embodiments, the contact metallization is the same as the backside metallic reflector 908. The metallic reflector 908 can also form the n-contact to the second n-type III-nitride layer 114 (topmost $n^+$GaN) and the metal can also be deposited to form an n-contact to the exposed first n-type III-nitride layer 118. Thus, the LED's contacts (n-contacts) can be deposited in one step.

Block 1418 represents depositing (e.g., wire) bond pad(s) 206a, 206b. In one embodiment, the dielectric coating 204 (e.g., multilayer dielectric coating) is underneath wire bond pads 206a, 206b on the device 200. In an embodiment of the device comprising a mesa 202, the device's p-side wire bond pad 206a is moved off of the mesa and connected with the n-contact 208a using a conformal conductive path or track 300. The device can also be diced into one or more of the LEDs or LDs having an edge L dimension of between 5 micrometers (μm) and 50 μm and/or patterned into an LED array or an LD array as illustrated in FIG. 14(*b*).

Block 1420 represents further processing, depositing the device 200 on a header 406 and in a cone 402 (e.g., comprising silicone), if necessary.

Block 1422 represents the end result, a device (e.g., as illustrated in FIGS. 4, 6, 7, 9, and 12).

In one embodiment, the device is a III-nitride optoelectronic or electronic device, comprising a chip 200a including n-type III-Nitride layers 118, 112 for current spreading on two sides of the device chip 200a.

The device can be one or more optoelectronic devices 200 (e.g., one or more LEDs or one or more laser diodes (LD)) each comprising a p-n junction structure 126 including a p-type III-nitride layer/material 112, 110 on or above a first III-nitride n-type layer 118; and a second III-nitride n-type layer/structure 102 on a surface treated surface 124 of the p-type III-nitride layer 110, forming a tunnel junction 108 between the p-type III-nitride layer 110 and the second III-nitride n-type layer/structure 102, 116, wherein the n-type III-Nitride layers 118 on both sides 112 of the device perform current spreading. In one or more embodiments, the LED has a wall plug efficiency or EQE over 70% (e.g., at least 78%) and/or a fractional EQE droop of less than 7% at 20 A/cm² drive current density and less than 15% at 35 A/cm² drive current density.

In one or more embodiments, the device 200 further comprises a multilayer dielectric coating 204 underneath a bond pad 206b on the chip 200a and between the bond pad 206b and a surface 230 of the chip 200a. In one or more embodiments, the device 200 includes a p-side bond pad 206a, wherein the chip 200a comprises a mesa 202 and the p-side bond pad 206a is separated from the mesa 202. In one or more embodiments, a conductive track 300 electrically connects the p-side bond pad 206a to an n-contact 208a on the mesa 202, wherein the conductive track 300 conforms with a shape of the chip 200a.

In one or more embodiments, the LED or LD is designed to have an emission wavelength below 400 nm (and optionally, aluminum is added to the n-type III-Nitride layers 118, 112-116 of the device 200 such that the bandgap of the n-type III-nitride layers 118, 112-116 is larger than the LED's emission photon energy).

In the case where the device is a laser diode (edge emitting laser diode or vertical cavity surface emitting laser), additional layers (e.g., waveguiding layers) can be added. One or more embodiments of the present invention could be applied to the device structures in [6] and [7].

In one or more embodiments, both the LED's or LDs's n-type contacts 208a, 208b are deposited in one step.

In one or more embodiments, the optoelectronic device 200 comprises a dielectric coating 204 underneath at least one of the device's bond pads 206a, 206b. In one embodiment, the dielectric coating 204 is only underneath the (e.g., wire) bond pads.

Advantages and Improvements

Current commercially-available III-nitride LEDs use an active region in a biased p-n junction to allow for electron and hole injection. The p-GaN is difficult to contact electrically and has low hole concentration and mobility. This means that p-GaN cannot be used as a current spreading layer and that traditional p-contacts will add significant voltage to devices. Despite these inherent problems, all commercial light emitting devices utilize a p-contact and a material other than p-GaN for current spreading, typically transparent conducting oxides (TCO).

The present invention uses a very highly doped ($n^+/p^+$) interface that allows electrons to tunnel between the valence band and conduction band and is called a tunnel junction (TJ). A low resistance tunnel junction on top of p-GaN allows for current spreading in n-GaN on both sides of the device as well as the use of low resistance n-type contacts on both sides. The use of n-GaN for current spreading allows for the elimination of a TCO or silver mirror in an LED design.

The present invention could improve the efficiency of III-Nitride LEDs by improving the light extraction out of the chip. This would reduce the energy use of LEDs and allow for more power out of a single chip.

Nomenclature

The term "III-nitrides" refers to any alloy composition of the (Ga,Al,In,B)N semiconductors having the formula $Ga_wAl_xIn_yB_zN$ where $0 \leq w \leq 1$, $0 \leq x \leq 1$, $0 \leq y \leq 1$, $0 \leq z \leq 1$, and $w+x+y+z=1$.

Spontaneous and piezoelectric polarization effects in GaN or III-nitride based devices are eliminated by growth of the device on nonpolar planes of the crystal. Such planes contain equal numbers of Ga (or group III atoms) and N atoms and are charge-neutral. Furthermore, subsequent nonpolar layers are equivalent to one another so the bulk crystal will not be polarized along the growth direction. Two such families of symmetry-equivalent nonpolar planes in GaN are the {11-20} family, known collectively as a-planes, and the {1-100} family, known collectively as m-planes. Thus, nonpolar III-nitride is grown along a direction perpendicular to the (0001) c-axis of the III-nitride crystal. Another approach to reducing polarization effects in (Ga,Al,In,B)N devices is to grow the devices on semi-polar planes of the crystal to form semipolar device layers. The term "semi-polar plane" (also referred to as "semipolar plane") can be used to refer to any plane that cannot be classified as c-plane, a-plane, or in-plane. In crystallographic terms, a semi-polar plane may include any plane that has at least two nonzero h, i, or k Miller indices and a nonzero 1 Miller index.

Polar c-plane devices can also be fabricated. The Gallium or Ga face of GaN is the $e^+$ or (0001) plane, and the Nitrogen or N-face of GaN or a III-nitride layer is the $c^-$ or (000-1) plane.

References

The following references are incorporated by reference herein:

[1] L. Esaki, Physical Review 109, (1958)

[2] J. Simon et al. Science 327 (5961): 60-64.

[3] S. Krishnamoorthy et al, Appl. Phys. Lett. 105, 141104 (2014).

[4] S. Krishnamoorth et al, Nano Lett. 13, 2570-2575 (2013).

[5] PCT International Utility Patent Application Ser. No. PCT/US16/41744, filed on Jul. 11, 2016, by Erin C. Young, Benjamin P. Yonkee, John T. Leonard, Tal Margalith, James S. Speck, Steven P. DenBaars, and Shuji Nakamura, entitled "HYBRID GROWTH METHOD FOR HI-NITRIDE TUNNEL JUNCTION DEVICES," (2003-224), which application claims the benefit under 35 U.S.C. § 119 of U.S. Provisional Application Ser. No. 62/190,929, filed on Jul. 10, 2015, by Erin C. Young, Benjamin P. Yonkee, John T. Leonard, Tal Margalith, James S. Speck, Steven P. DenBaars, and Shuji Nakamura, entitled "HYBRID GROWTH METHOD FOR III-NITRIDE TUNNEL JUNCTION DEVICES," (2015-904-1).

[6] E. C. Young, B. P. Yonkee, F. Wu, S. H. Oh, S. P. Den Baars, S. Nakamura, et al., Appl. Phys. Express. 9, 022102. (2016).

[7] John T. Leonard, Steven P. DenBaars, James S. Speck, and Shuji Nakamura, entitled "Demonstration of a III-nitride edge-emitting laser diode utilizing a GaN tunnel junction Contact," vol. 24, No. 7|DOI:10.1364/OE.24.007816|OPTICS EXPRESS 7816.

[8] A. H. Reading, J. J. Richardson, C.-C. Pan, S. Nakamura, and S. P. DenBaars, "High efficiency white LEDs with single-crystal ZnO current spreading layers deposited by aqueous solution epitaxy," *Opt. Express, vol.* 20, no. Si, p. A13, 2012.

[9] Yonkee et. al., "Silver free III-nitride flip chip light emitting diode with wall plug efficiency over 70% utilizing a GaN tunnel junction," Applied Physics Letters, Volume 109, Issue 19, id.191104.

Conclusion

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A III-nitride optoelectronic or electronic device, comprising:
 a chip including:
  a p-type III-nitride layer;
  a first n-type III-nitride layer including a first current spreading layer;
  an active region between the first n-type III-nitride layer and the p-type III-nitride layer;
  a tunnel junction between the p-type III-Nitride layer and a second n-type III-nitride layer, the second n-type III-nitride layer including a second current spreading layer;
 a bond pad electrically connected to the second n-type III-nitride layer; and
 a multilayer dielectric coating underneath the bond pad and between the bond pad and a surface of the chip, wherein the chip comprises a mesa and the bond pad comprises a p-side bond pad separated from the mesa.

2. The device of claim 1, wherein:
 the chip comprises a mesa,
 the device further comprises a conductive track electrically connecting the bond pad to the second n-type n-type III-nitride layer on top of the mesa, and
 the conductive track including the multilayer dielectric coating conforms with a shape of the chip and is on a sidewall of the mesa including sidewalls of the active region, the p-type III-nitride layer, and the second n-type III-Nitride layer.

3. The device of claim 1, wherein the device has a wall plug efficiency and/or external quantum efficiency (EQE) over 70%.

4. The device of claim 1, wherein the device has a fractional External Quantum Efficiency (EQE) droop of less than 7% at 20 A/cm² drive current density and less than 15% at 35 A/cm² drive current density.

5. The device of claim 1, further comprising:
 a metal layer between the multilayer dielectric coating and the bond pad; and
 a plurality of openings in the multilayer dielectric coating, wherein the metal layer electrically contacts the second n-type III-Nitride layer through the openings.

6. The device of claim 5, wherein the metal layer comprises aluminum and the multilayer dielectric coating comprises more than 3 dielectric layers so that over 98% of electromagnetic radiation having a wavelength of 450 nm is reflected back from the bond pad.

7. The device of claim 1, wherein the device comprises one or more light emitting diodes (LEDs) or one or more laser diodes (LDs).

8. The device of claim 7, further comprising one or more of the LEDs or one or more of the LDs have an edge dimension of between 5 micrometers (μm) and 50 μm.

9. The device from claim 8, wherein the LEDs or the LDs comprise an LED array or an LD array.

10. The device of claim 7, wherein the LED's emission wavelength or the LD's emission wavelength is below 400 nm.

11. The device of claim 10, wherein aluminum is added to the n-type III-Nitride layers of the device such that the bandgap of the n-type III-nitride layers is larger than the LED's emission photon energy.

12. A method of fabricating a III-nitride optoelectronic or electronic device, comprising:
 forming a chip comprising:

a p-type III-nitride layer;

a first n-type III-nitride layer including a first current spreading layer;

an active region between the first n-type III-nitride layer and the p-type III-nitride layer; and a tunnel junction between the p-type III-nitride layer and a second n-type III-nitride layer, the second n-type III-nitride layer including a second current spreading layer;

depositing a multilayer dielectric coating; and depositing a bond pad so that multilayer dielectric coating is underneath the bond pad and between the bond pad and a surface of the chip, wherein the bond pad is electrically connected to the second n-type III-nitride layer, wherein the chip comprises a mesa and the bond pad comprises a p-side bond pad separated from the mesa.

13. The method of claim 12, further comprising:

forming a mesa in the chip; and depositing a conductive track electrically connecting the bond pad to the second n-type III-nitride layer, wherein the conductive track including the multilayer dielectric coating conforms with a shape of the chip and is on a sidewall of the mesa including sidewalls of the active region, the p-type III-nitride layer, and the second n-type III-Nitride layer.

14. The method of claim 12, wherein the device comprises one or more light emitting diodes (LEDs) or one or more laser diodes (LDs).

15. The method of claim 14, wherein both the LED's n-type contacts or both the LD's n-type contacts are deposited in one step.

* * * * *